United States Patent
Koh et al.

[11] Patent Number: 6,099,917
[45] Date of Patent: Aug. 8, 2000

[54] PRETREATMENT METHOD FOR A SUBSTRATE SURFACE USING ION BEAM RADIATION AND NITRIDE THIN FILM FORMING METHOD USING THEREOF

[75] Inventors: Seok-Keun Koh; Hyung-Jin Jung; Won-Kook Choi; Dong-Hwa Kum; DongJin Byun, all of Seoul, Rep. of Korea

[73] Assignee: Korea Institute of Science and Technology, Rep. of Korea

[21] Appl. No.: 09/192,997

[22] Filed: Nov. 17, 1998

[30] Foreign Application Priority Data

Nov. 21, 1997 [KR]  Rep. of Korea ............. 97-61766

[51] Int. Cl.[7] ............... C23C 14/48; C23C 14/02
[52] U.S. Cl. ............... 427/530; 427/523; 427/533; 427/255.394
[58] Field of Search ............... 427/533, 255.394, 427/523, 530

[56] References Cited

U.S. PATENT DOCUMENTS 5,246,741  9/1993  Ouhata et al. ............... 427/524
5,296,395  3/1994  Khan et al. ............... 437/40
5,880,485  3/1999  Marx et al. ............... 257/94

OTHER PUBLICATIONS

Krefft, G. B. et al., "Volume expansion and annealing compaction of ion–bombarded single–crystal and polycrystalline α–Al$_2$O$_3$a)", *J. Appl. Phys.*, 49(5), May 1978, pp. 2725–2730.

*Primary Examiner*—Roy V. King
*Attorney, Agent, or Firm*—Morrison & Foerster

[57] ABSTRACT

A method for modifying an (oxide) material of a substrate surface to a nitride material by radiating reactive ion particles having a certain amount of energy onto the substrate surface is disclosed. The thin film deposited on the surface-modified substrate has improved material properties. In particular, a surface treatment using ion beam is executed on an Al$_2$O$_3$ substrate to initially form an AlN thin film, and then a GaN thin film is deposited on said AlN thin film. From this, it is possible to obtain a high quality GaN thin film having a better material property, compared with a GaN thin film according to the prior art.

20 Claims, 5 Drawing Sheets ns rumenPRETREATMENT METHOD FOR A
SUBSTRATE SURFACE USING ION BEAM
RADIATION AND NITRIDE THIN FILM
FORMING METHOD USING THEREOF

BACKGROUND OF THE INVENTION

1. Field of the Invention

The present invention relates to a pretreatment method for a substrate surface to form a high-quality thin film thereon by reducing the difference in lattice constant between the substrate and a deposited material, and a thin film forming method using said pretreatment method.

2. Description of the Background Art

Conventionally, respective lattice constants of a substrate and a thin film being deposited thereon are different from each other, and when a thin film is is deposited on the substrate, such a difference in the lattice constants cause the lattice sizes of the deposited thin film to be also different from that of a substrate in size, so that the thin film may be formed on the substrate mostly in form of a polycrystal growth instead of an epitaxial growth, thereby making it difficult to form a high-quality thin film. In particular, when utilizing a chemical vapor deposition (CVD) technique in which an organic metal compound is dissolved by heating the substrate, and then is deposited on the substrate, respective layers in the thin film are closely related to a lattice structure of the substrate. Here, the surface state of the substrate significantly affects the growth of a material being deposited thereon.

A thin film growth on a substrate is influenced by factors such as a nucleus formation, a growth rate of nucleus and a nucleus orientation of already grown nucleus. Here, the nucleus formation is influenced by an initial state of the target substrate, and the nucleus orientation is affected by the main orientation of the original substrate. Therefore, when a thin film is formed on the substrate surface, the initial state of the substrate is most influential on the thin film formation.

SUMMARY OF THE INVENTION

Accordingly, it is an object of the present invention to provide a method for treating a substrate surface which affects an initial thin film formation.

That is, it is an object of the present invention to provide a method for treating a substrate surface to reduce the difference between the lattices spacing of the substrate material and that of a deposition material thereon, thereby a high-quality thin film can be formed on the surface-treated substrate.

It is another object of the present invention to provide a method for forming a high quality thin film with such as, an improved crystalline property on the substrate surface which is pretreated for the surface-modifying.

The objects and advantages of the present invention will become more readily apparent from the detailed description given hereinafter. However, it should be understood that the detailed description and specific example, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

In order to achieve the above described objects, there is provided a method for pretreating a substrate surface according to the present invention, wherein a predetermined amount of reactive $N_2^+$ ion beam having an energy of 100~10000 eV is radiated onto the substrate to modify the substrate surface into a nitride surface.

Further, to achieve the above described objects, there is provided a thin film deposition method which includes the steps of pretreating a substrate surface by radiating a predetermined amount of reactive $N_2^+$ ion beam having an energy of 100~10000 eV onto the substrate to modify the substrate surface into a intermediate nitride surface, and forming a nitride thin film which is different in kinds from an intermediate nitride material formed on the surface-modified substrate surface in the previous step, using a deposition technique. The deposition technique is one selected from a chemical vapor deposition (CVD) method, a molecular beam epitaxy method, a plasma enhanced CVD method, and a physical deposition methods including a thermal evaporation method, an ion beam sputtering method, a radio frequency sputtering method, and a direct current sputtering method.

Figure 1:
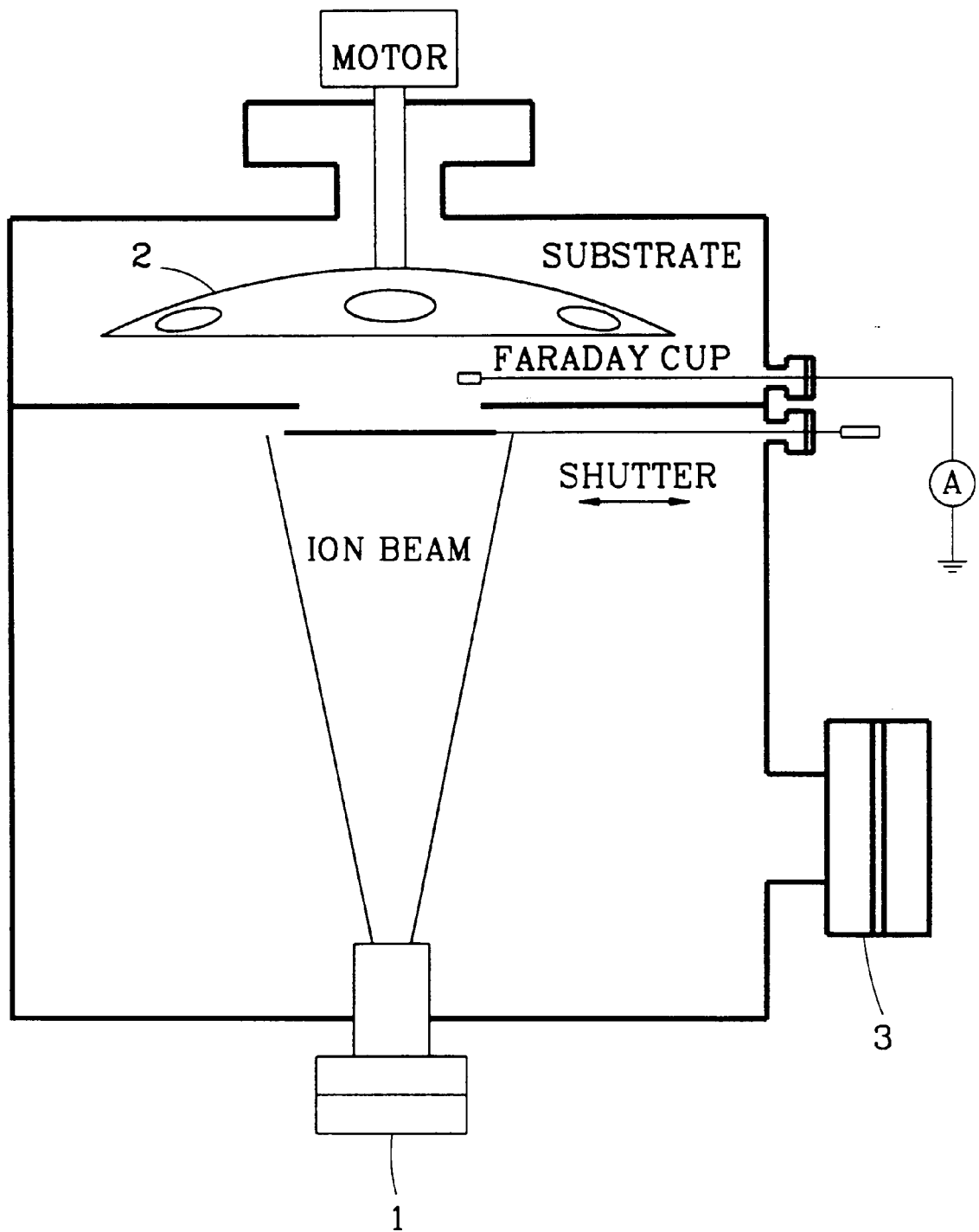
FIG. 1 is a schematic view illustrating a structure of a surface pretreatment apparatus for modifying an oxide substrate surface into a nitride according to the present invention.

With reference to FIG. 1, the ion beam radiation apparatus for modifying the substrate surface according to the present invention comprises an ion source (1) for is generating an ion beam, an ion beam amperemeter A for controlling and measuring the amount of radiated ions having energy, and a sample holder (2) for appropriately supporting a target substrate intended to be surface-treated by use of ions. The ion beam radiation apparatus for modifying the substrate surface further includes a vacuum pump apparatus (3) for forming a vacuum reservoir which facilitates an ion beam generation, and a gauge for measuring vacuum degrees.

Figure 2A:
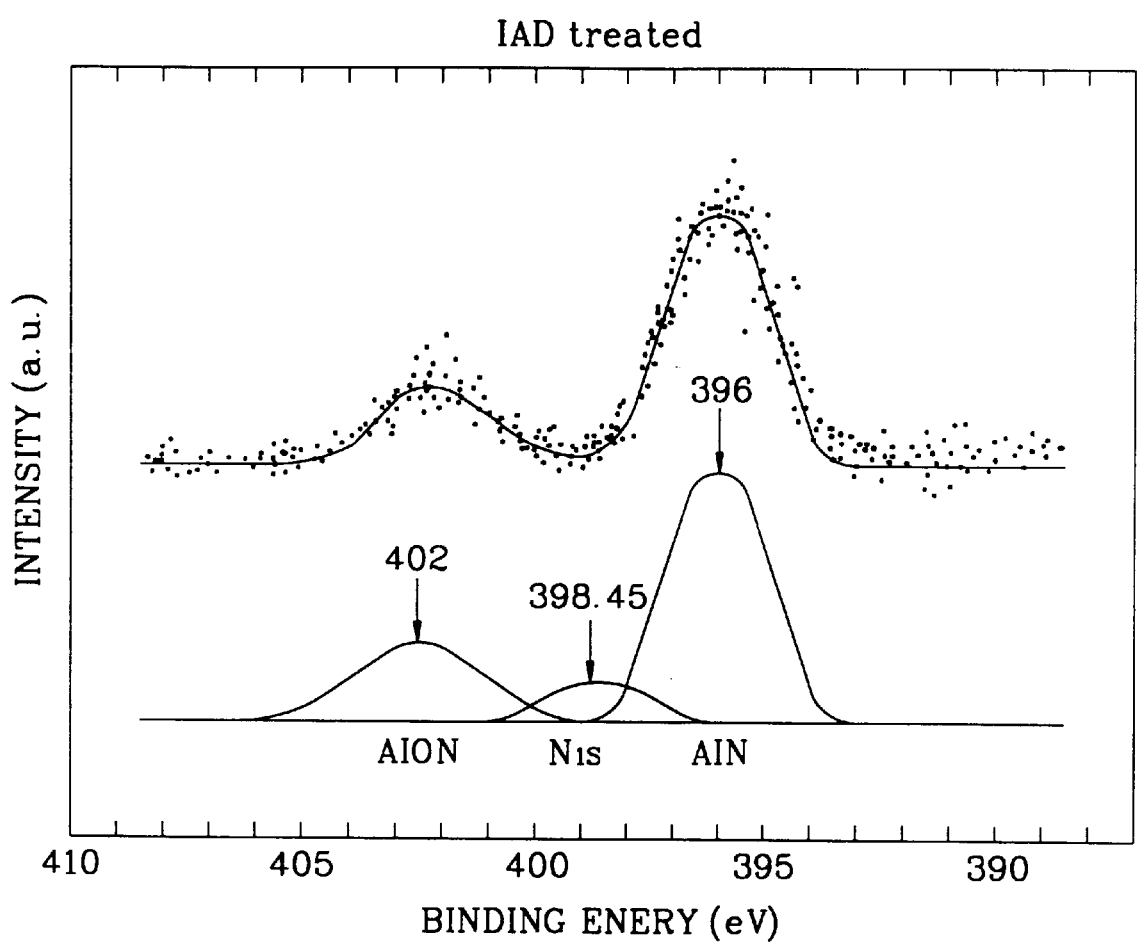
FIG. 2A illustrates an $N_{ls}$ XPS(X-ray Photoelectron Spectroscopy) surface analytic spectrum for a sample which is formed by radiating an $N_2^+$ ion beam on a monocrystal $Al_2O_3$ substrate according to the present invention.

FIG. 2A shows a spectrum graph of which shows the results from an surface chemistry analysis for a substrate surface by an XPS (X-ray Photoemission Spectroscopy) after a surface treatment for the $Al_2O_3$ substrate by use of an reactive ion radiation according to the present invention, wherein the surface treatment is carried out by radiating $N_2^+$ ion beam having 1 keV of energy with an amount of $1 \times 10^{16}/cm^2$ onto the $Al_2O_3$ substrate. As shown therein, the peak at the binding energy of 396.02 eV denotes a nitrogen among AlN created on the substrate surface, and the peak at the binding energy of 398.45 eV represents the peak for a nitrogen which is not bound with aluminum that exists on the substrate surface. Here, an outstanding variation may be a nitrogen peak of AlON formed at 402.4 eV, which is formed by a step in which a nitrogen is combined with an oxygen on the alumina substrate.

Figure 2B:
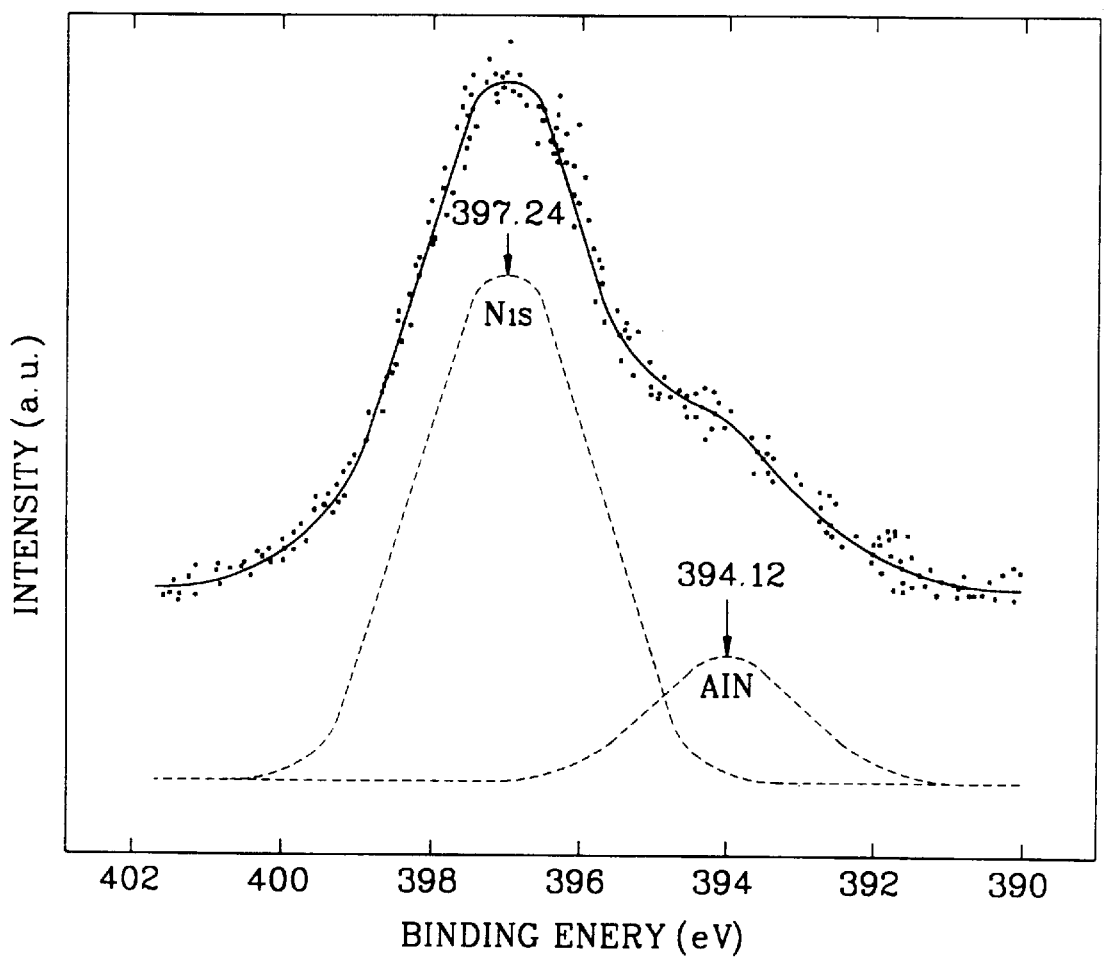
FIG. 2B illustrates an $N_{ls}$ XPS surface analytic spectrum for a sample formed by nitrification treating a monocrystal $Al_2O_3$ substrate for 5 minutes at 1040° C. under a nitrogen atmosphere according to a conventional art.

FIG. 2B is a graph illustrating a XPS surface chemical analytic spectrum for a nitride material formed on a mono crystal $Al_2O_3$ substrate which is nitrification-treated for 5 minutes at a 1 slm nitrogen flow rate in an atmospheric pressure chemical vapor deposition apparatus (horizontal type) at 1040° C. under a nitrogen atmosphere, wherein the nitrification treatment is a prior art. As shown therein, the nitrogen peak at 397.24 eV represents that a significant amount of nitrogen is deposited on the substrate surface, and the nitrogen peak at 394.12 eV represents the nitrogen in AlN, which explains that a portion of the nitrogen is changed to AlN. Based on the XPS nitrogen binding energy analysis, the present invention treats the $Al_2O_3$ substrate using an ion beam process to obtain a larger amount of nitro-aluminum AlN on the substrate surface than that from nitrofication treatment under a nitrogen atmosphere. In addition, it is understood that nitride material, in particular AlN formed on the substrate surface serve as a significant factor in the thin film formation of other kinds of nitride which are to be formed on the pretreated substrate surface.

Figure 3:
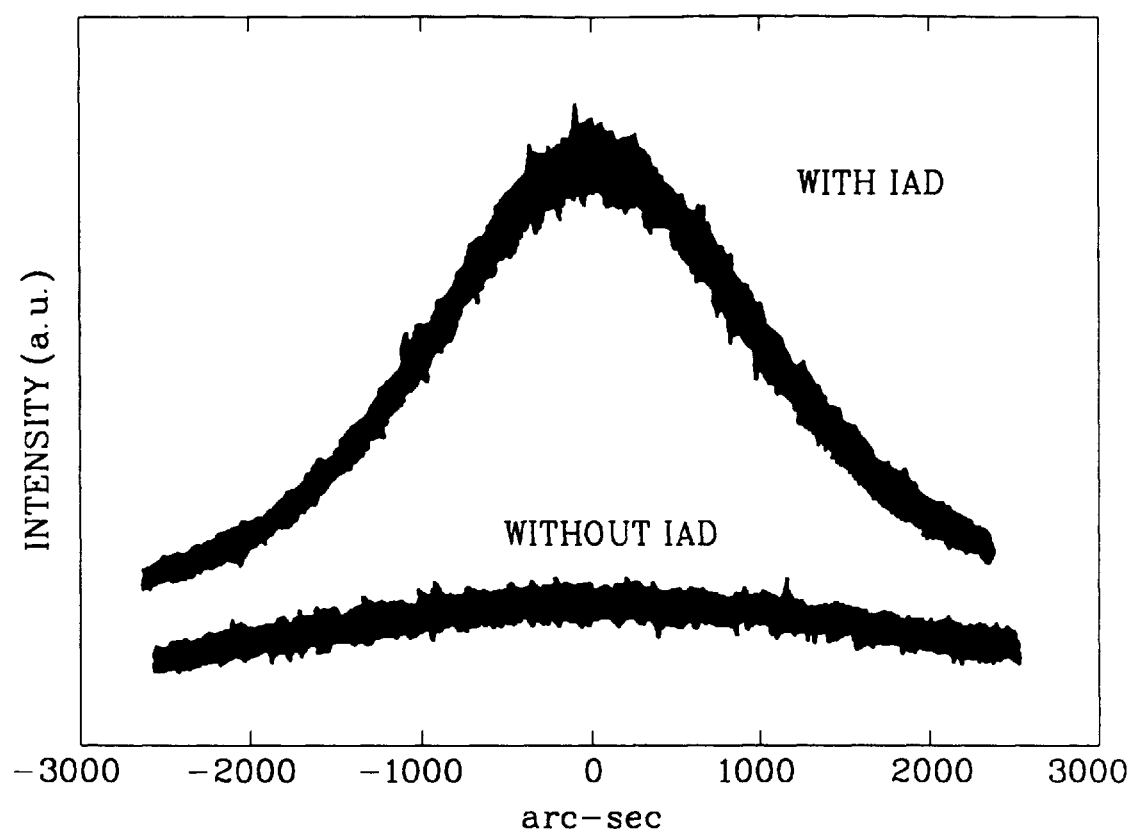
FIG. 3 is a graph comparing a double crystal XRD (X-Ray Dispersion) spectrum for GaN(200) thin film which is grown according to the present invention, with that for GaN thin film grown according to the conventional art.

FIG. 3 shows a GaN(200)-oriented peak intensity as a result of a double crystal X-ray diffraction for the GaN thin film formed by a chemical vapor deposition. As shown therein, the GaN formed on a non-pretreated substrate surface has a less degree of crystal property, while the crystal property of the GaN thin film formed on the $Al_2O_3$ substrate which is surface-treated by the ion beam radiation according to the present invention is relatively large. From this result, it is understood that the crystal property of the GaN thin film can be improved when growing a thin film on the surface-modified substrate according to the present invention. Such a crystalline property variation of thin film material is closly related to the variation of the other property thereof.

Figure 4:
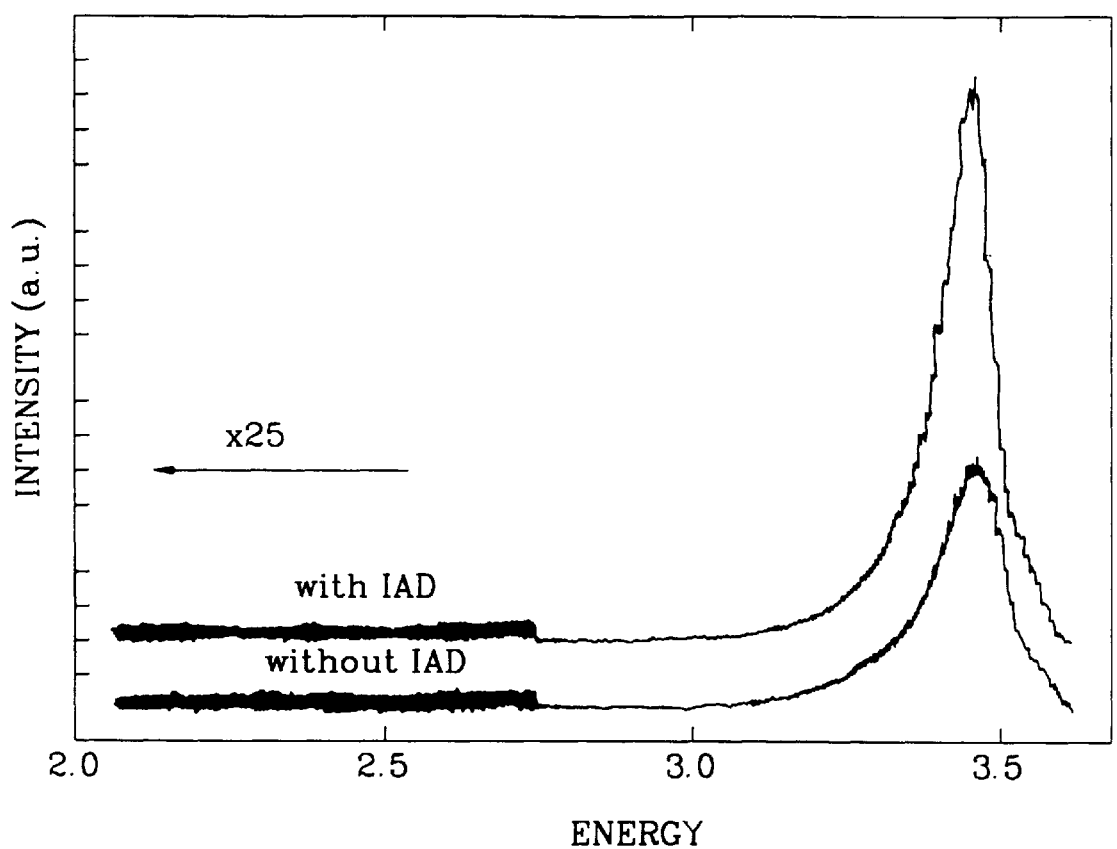
FIG. 4 is a graph comparing a photoluminascence capacity at 10 K of the GaN thin film formed on the substrate surface by a surface modifying process according to the present invention, with that of the GaN thin film formed according to the conventional art.

FIG. 4 shows a graph comparing the photoluminescence capacity of the GaN thin film according to the present invention, which is an example of the above-mentioned property variation, with that of the GaN thin film according to the conventional art. Therein, the comparison with regard to the photoluminescence capacity is executed at a temperature of 10 K, and it shows that the specific photoluminescence peak is formed at the energy location of 3.4 eV. The weak peak shown in FIG. 4 represents a luminescent intensity of the GaN thin film formed on the oxide substrate which was not surface-modified according to the conventional art, whereas the luminescent intensity of the GaN thin film formed on the oxide substrate which was surface-pretreated according to the present invention is much stronger. Also, a full width at half maximum of the specific photoluminescence peak according to the present invention in FIG. 4 is smaller than that of the same according to the prior art, which also explains that the crystal property of the GaN thin film was improved by the present invention. Likewise, the thin film grown on the surface-pretreated substrate surface according to the present invention shows a high quality in comparison with the thin film deposited by prior art without a surface treatment.

When the oxide substrate surface is modified into a nitride substance by radiating reactive ion particles having a certain amount of energy onto the surface of said oxide substrate while directly blowing a reactive gas selected depending on a deposition material onto the oxide material surface, as fully understood by the XPS surface chemical analysis and a photoluminescence capacity experiment with regard to nitride thin film generated on the substrate surface as above, the thin film formed on the surface-pretreated substrate surface according to the present invention has significantly improved material properties such as a crystal property, compared to the thin film formed on the non-pretreated substrate by the prior art.

As the present invention may be embodied in several forms without departing from the spirit of the essential characteristics thereof, it should also be understood that the above-described embodiments are not limited by any of the details of the foregoing description, unless otherwise specified, but rather should be constructed broadly within its spirit and scope as defined in the appended claims, and therefore all changes and modifications that fall within meets and bounds of the claims, or equivalences of such meets and bounds are therefore intended to embrace the appended claims.

What is claimed is:

1. A method for pretreating an oxide substrate surface, comprising:

providing the oxide substrate; and radiating reactive $N_2^+$ ion beam having an energy of 100–10000 eV onto the oxide substrate to modify the oxide substrate surface into a material comprising AlON and AlN.

2. The method of claim 1, wherein the ion beam has an energy of 1 keV.

3. The method of claim 1, further comprising forming a nitride thin film by a deposition technique selected from the group consisting of a chemical vapor deposition (CVD) method, a molecular beam epitaxy method, and a physical vapor deposition (PVD) method, wherein the nitride thin film is different in composition from that of said material comprising AlON and AlN.

4. The method of claim 1, wherein the deposition technique is selected from the group consisting of an ion beam sputtering method, a plasma enhanced CVD method, a thermal evaporation method, a radio frequency (RF) sputtering method and a direct current (DC) sputtering method, wherein the nitride thin film is different in composition from that of said material comprising AlON and AlN.

5. A thin film deposition method, comprising:

pretreating an oxide substrate surface by radiating reactive $N_2^+$ ion beam having an energy of 100–10000 eV onto the oxide substrate to modify the oxide substrate surface into an intermediate material comprising AlON and AlN; and forming a nitride thin film on the pre-treated substrate by a deposition technique.

6. The method of claim 5, wherein the ion beam has an energy of 1 keV, and the nitride thin film comprises GaN.

7. The method of claim 5, wherein the deposition technique is selected from the group consisting of a chemical vapor deposition (CVD) method, a molecular beam epitaxy method, and a physical vapor deposition (PVD) method.

8. The method of claim 6, wherein the deposition technique is selected from the group consisting of a chemical vapor deposition (CVD) method, a molecular beam epitaxy method, and a physical vapor deposition (PVD) method.

9. The method of claim 5, wherein the deposition technique is selected from the group consisting of an ion beam sputtering method, a plasma enhanced CVD method, a thermal evaporation method, a radio frequency (RF) sputtering method and a direct current (DC) sputtering method.

10. The method of claim 6, wherein the deposition technique is selected from the group consisting of an ion beam sputtering method, a plasma enhanced CVD method, a thermal evaporation method, a radio frequency (RF) sputtering method and a direct current (DC) sputtering method.

11. A method for pretreating a metal oxide substrate surface, comprising:

providing the metal oxide substrate; and radiating reactive $N_2^+$ ion beam having an energy of 100–10000 eV onto the metal oxide substrate to modify the metal oxide substrate surface into a nitride material comprising AlON.

12. The method of claim 11, wherein the ion beam has an energy of 1 keV.

13. The method of claim 11, further comprising forming a nitride thin film by a deposition technique selected from the group consisting of a chemical vapor deposition (CVD) method, and a physical vapor deposition (PVD) method, wherein the nitride thin film is different in composition from that of said material comprising AlON and AlN.

14. The method of claim 11, wherein the deposition technique is selected from the group consisting of an ion beam sputtering method, a plasma enhanced CVD method, a thermal evaporation method, a radio frequency (RF) sputtering method and a direct current (DC) sputtering method, wherein the nitride thin film is different in composition from that of said material comprising AlON and AlN.

15. A thin film deposition method, comprising:

pretreating a metal oxide substrate surface by radiating reactive $N_2^+$ ion beam having an energy of 100–10000 eV onto the metal oxide substrate to modify the metal oxide substrate surface into an intermediate nitride material comprising AlON; and forming a nitride min film on the intermediate nitride material by a deposition technique.

16. The method of claim 14, wherein the ion beam has an energy of 1 keV, and the nitride thin film comprises GaN.

17. The method of claim 15, wherein the deposition technique is selected from the group consisting of a chemical vapor deposition (CVD) method, a molecular beam epitaxy method, and a physical vapor deposition (PVD) method.

18. The method of claim 16, wherein the deposition technique is selected from the group consisting of a chemical vapor deposition (CVD) method, a molecular beam epitaxy method, and a physical vapor deposition (PVD) method.

19. The method of claim 15, wherein the deposition technique is selected from the group consisting of an ion beam sputtering method, a plasma enhanced CVD method, a thermal evaporation method, a radio frequency (RF) sputtering method and a direct current (DC) sputtering method.

20. The method of claim 16, wherein the deposition technique is selected from the group consisting of an ion beam sputtering method, a plasma enhanced CVD method, a thermal evaporation method, a radio frequency (RF) sputtering method and a direct current (DC) sputtering method.

* * * * *